(12) United States Patent
Cheng

(10) Patent No.: US 12,033,685 B2
(45) Date of Patent: Jul. 9, 2024

(54) METHOD FOR ADJUSTING MARGIN, CIRCUIT FOR ADJUSTING MARGIN AND MEMORY

(71) Applicant: CHANGXIN MEMORY TECHNOLOGIES, INC., Hefei (CN)

(72) Inventor: Biao Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 114 days.

(21) Appl. No.: 17/854,273

(22) Filed: Jun. 30, 2022

(65) Prior Publication Data
US 2023/0290401 A1    Sep. 14, 2023

(30) Foreign Application Priority Data
Mar. 14, 2022   (CN) .......................... 202210247132.9

(51) Int. Cl.
| G11C 11/4076 | (2006.01) |
| G11C 29/02 | (2006.01) |
| G11C 7/04 | (2006.01) |
| G11C 7/22 | (2006.01) |
| G11C 29/50 | (2006.01) |

(52) U.S. Cl.
CPC ........ *G11C 11/4076* (2013.01); *G11C 29/028* (2013.01); *G11C 7/04* (2013.01); *G11C 7/222* (2013.01); *G11C 29/023* (2013.01); *G11C 29/50012* (2013.01); *G11C 2207/2254* (2013.01)

(58) Field of Classification Search
CPC ........ G11C 11/4076; G11C 2207/2254; G11C 29/023; G11C 29/028; G11C 29/50012; G11C 7/04; G11C 7/222

USPC .......................................................... 365/104
See application file for complete search history.

(56) References Cited

U.S. PATENT DOCUMENTS

| 9,460,803 | B1 * | 10/2016 | Tang ..................... G11C 7/1066 |
| 10,007,311 | B2 | 6/2018 | Raghu et al. |
| 10,659,215 | B1 * | 5/2020 | Wang .................... G11C 7/1084 |
| 2004/0218438 | A1 * | 11/2004 | Do .......................... G11C 29/14 365/201 |
| 2009/0154266 | A1 * | 6/2009 | Fukumoto ........... G06F 13/1689 365/233.13 |
| 2014/0245028 | A1 | 8/2014 | Chen et al. |
| 2019/0096460 | A1 * | 3/2019 | Duggal ................ G11C 7/1012 |

FOREIGN PATENT DOCUMENTS

| CN | 105009020 A | | 10/2015 | |
| CN | 112612596 A | * | 4/2021 | ......... G06F 12/0238 |
| CN | 107767915 B | | 7/2021 | |

* cited by examiner

Primary Examiner — Ly D Pham
(74) Attorney, Agent, or Firm — Kilpatrick Townsend & Stockton LLP

(57) ABSTRACT

A method for adjusting margin, a circuit for adjusting margin, and a memory are provided. The method is applicable for a memory including a plurality of delay sub-circuits. The method includes: determining a voltage parameter and a temperature parameter, obtaining a target delay value by performing calculation on the voltage parameter and the temperature parameter through a preset time margin model; and adjusting a time margin of the memory by controlling working states of the plurality of delay sub-circuits according to the target delay value.

17 Claims, 6 Drawing Sheets

METHOD FOR ADJUSTING MARGIN, CIRCUIT FOR ADJUSTING MARGIN AND MEMORY

CROSS-REFERENCE TO RELATED APPLICATION

This application claims priority to Chinese Patent Application No. 202210247132.9, entitled "METHOD FOR ADJUSTING MARGIN, CIRCUIT FOR ADJUSTING MARGIN AND MEMORY" and filed to the China National Intellectual Property Administration on Mar. 14, 2022. The disclosure of Chinese Patent Application No. 202210247132.9 is hereby incorporated by reference in its entirety.

BACKGROUND

Dynamic Random Access Memory (DRAM) is a semiconductor memory device commonly used in computers. Before the DRAM leaves the factory, it is necessary to test the DRAM under various conditions, and determine a good delay adjustment value according to the test result, and then use the circuit for adjusting margin to fix the delay adjustment value to ensure the normal working of the DRAM. In other words, once the delay adjustment value is determined, it cannot be changed and cannot be optimized under different environmental conditions, which affects the performance of DRAM.

SUMMARY

The present disclosure relates to the technical field of integrated circuits, and in particular, to a method for adjusting margin, a circuit for adjusting margin, and a memory.

The present disclosure provides a method for adjusting margin, a circuit for adjusting margin and a memory. The target delay value can be adaptively determined according to the actual working conditions, and the reliability of the memory can be improved.

The technical solutions of the present disclosure are implemented as follows.

In the first aspect, the embodiments of the present disclosure provide a method for adjusting margin, which is applicable for a memory including a plurality of delay sub-circuits. The method includes the following operations.

A voltage parameter and a temperature parameter are determined.

A target delay value is obtained by performing calculation on the voltage parameter and the temperature parameter through a preset time margin model.

A time margin of the memory is adjusted by controlling working states of the plurality of delay sub-circuits according to the target delay value.

In the second aspect, the embodiments of the present disclosure provide a circuit for adjusting margin, which is applicable for a memory. The circuit includes a parameter determination sub-circuit, a calculation sub-circuit and a delay adjustment sub-circuit.

The parameter determination sub-circuit is configured to determine a voltage parameter and a temperature parameter.

The calculation sub-circuit is configured to obtain a target delay value by performing calculation according to the voltage parameter and the temperature parameter through a preset time margin model.

The delay adjustment sub-circuit includes a plurality of delay sub-circuits, and is configured to adjust a time margin of the memory by controlling working states of the plurality of delay sub-circuits according to the target delay value.

In the third aspect, the embodiments of the present disclosure provide a memory including the circuit for adjusting margin described in the second aspect.

DETAILED DESCRIPTION

Figure 1:
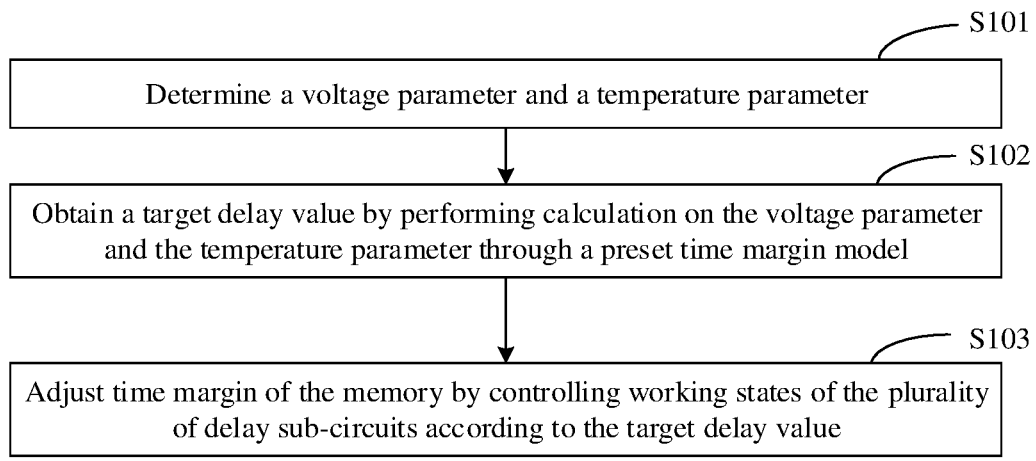
FIG. 1 is a schematic flowchart of a method for adjusting margin provided by the embodiments of the present disclosure.

The embodiments of the present disclosure provide a method for adjusting margin, a circuit for adjusting margin, and a memory. The target delay value is adaptively determined according to actual working conditions (voltage, temperature), and the memory is expected to have better time margins under various working conditions, thereby improving the reliability of the memory.

The technical solutions in the embodiments of the present disclosure will be clearly and completely described below with reference to the accompanying drawings in the embodiments of the present disclosure. It should be understood that the specific embodiments described herein are only used to explain the related disclosure, but not to limit the present disclosure. In addition, it should be noted that, for the convenience of description, only the parts related to the relevant disclosure are shown in the drawings.

Unless otherwise defined, all technical and scientific terms used herein have the same meaning as those skilled in the art, belonging to this application, usually understand. The terms used herein are only used for describing the purpose of the embodiments of this application, but not intended to limit this application.

"Some embodiments" involved in the following descriptions describes a subset of all possible embodiments. However, it can be understood that "some embodiments" may be the same or a different subset of all possible embodiments, and can be combined without conflicts.

It should be pointed out that the term "first\second\third" involved in the embodiments of the present disclosure is only used to distinguish similar objects, and does not represent a specific ordering of objects. It can be understood that "first\second\third" can be interchanged to specific sequences or orders if allowed, so that the embodiments of the present disclosure described herein can be implemented in an order other than the illustrated or described ones.

It can be understood that a circuit for adjusting margin used for adjusting the delay parameter of a signal exists in the DRAM, which includes a fuse element or an anti-fuse element. Before the DRAM leaves the factory, the specific delay value is determined by calling the reserved test mode, and then the fuse element or anti-fuse element is fused according to the delay value, thereby fixing the delay value. However, the fusing process of the fuse or anti-fuse is irreversible. In other words, the delay value of memory cannot be changed once it is fixed. However, the delay value needs to be determined according to the empirical value, or chosen in a compromise according to the actual test results. Although it can meet the time margin requirements under various working conditions to a certain extent, the delay value is a fixed value for any working condition and is not an optimal value for each working condition, which affects the performance of the semiconductor memory.

Based on this, the embodiments of the present disclosure provide a method for adjusting margin, which is applicable for a memory including a plurality of delay sub-circuits. The method includes the following operations. A voltage parameter and a temperature parameter are determined. The target delay value is obtained by performing calculation on the voltage parameter and the temperature parameter through a preset time margin model. The time margin of the memory is adjusted by controlling the working states of the plurality of delay sub-circuits according to the target delay value. In this way, the target delay value is adaptively determined according to the actual working conditions (voltage, temperature), and the memory is expected to have better time margins under various working conditions, thereby improving the reliability of the memory.

The embodiments of the present disclosure will be described in detail below with reference to the accompanying drawings.

In the embodiments of the present disclosure, referring to FIG. 1, it shows a schematic flowchart of a method for adjusting margin provided by the embodiments of the present disclosure. As shown in FIG. 1, the method includes the following steps.

In step S101, a voltage parameter and a temperature parameter are determined.

It should be noted that the method for adjusting margin provided by the embodiments of the present disclosure is applicable for a memory including multiple delay sub-circuits, and the memory may be a non-volatile memory or a volatile memory.

In the memory, a plurality of delay sub-circuits are connected in series and jointly arranged on a certain signal path. The input end of the delay sub-circuit in the first place is used for receiving the target signal, and the output end of each delay sub-circuit is connected to the input end of a next delay sub-circuit, and the output end of the delay sub-circuit in the last place is used for outputting the delayed target signal. The target signal may be any working signal in the memory.

In particular, the working state of each delay sub-circuit is adjustable. Specifically, the working state includes a delay working state and a transmission working state. The delay working state instructs the delay sub-circuit to perform delay transmission process on the input signal, and the transmission working state instructs the delay sub-circuit to perform direct transmission process on the input signal.

In this way, for different working conditions (voltage, temperature), the delay time of the target signal (hereinafter referred to as the target delay value) may be adjusted by adjusting the working state of the delay sub-circuit, so that the delay value of the target signal is always the optimal value, thereby increasing the time margin of the memory, and improving the time margin of the memory at the same time.

In some embodiments, the operation of determining the voltage parameter and the temperature parameter includes the following operations.

A current voltage and a current temperature are acquired.

The voltage parameter is generated by comparing the current voltage with a reference voltage.

The temperature parameter is generated by performing encoding process on the current temperature.

It should be noted that the embodiments of the present disclosure sets several voltage ranges, and the voltage parameter is determined according to the voltage range to which the current voltage belongs, which can reduce the amount of calculation in the subsequent process. In addition, in the embodiments, the temperature parameter is obtained by directly encoding the current temperature. Here, the encoding manner is not specifically limited.

It should be understood that in other embodiments, several temperature ranges may also be set, and the temperature parameter is determined according to the temperature range to which the current temperature belongs.

In some embodiments, 4 voltage ranges may be preset. That is to say, the reference voltage includes a first voltage threshold, a second voltage threshold and a third voltage threshold. The operation of generating the voltage parameter by comparing the current voltage with the reference voltage includes the following operations.

A first voltage parameter is generated in a case that the current voltage is less than the first voltage threshold.

A second voltage parameter is generated in a case that the current voltage is greater than or equal to the first voltage threshold and the current voltage is less than the second voltage threshold.

A third voltage parameter is generated in a case that the current voltage is greater than or equal to the second voltage threshold and the current voltage is less than the third voltage threshold.

A fourth voltage parameter is generated in a case that the current voltage is greater than or equal to the third voltage threshold.

Exemplarily, the first voltage threshold is 1.1V, the second voltage threshold is 1.2V, and the third voltage threshold is 1.3V.

In this way, the actual working conditions of the memory can be indicated by using the voltage parameter and the temperature parameter, and subsequently, the working state of each delay sub-circuit can be determined pertinently, so as to implement an optimal target delay value, which can improve the reliability of the memory.

In step S102, a target delay value is obtained by performing calculation on the voltage parameter and the temperature parameter through a preset time margin model.

It should be noted that the preset time margin model is established in advance according to the test result of the memory, and is used for representing the relationships among temperature, voltage and delay value.

Specifically, the method further includes the following operations.

A test result is obtained by performing a time margin test on the memory. The test result includes delay values of the memory at different temperatures and different voltages.

An initial time margin model is determined by performing curve fitting process according to the test result. The initial time margin model includes initial results of model parameters.

Target results of the model parameters are obtained by performing a shift simplification process on the initial results of the model parameters.

The preset time margin model is obtained according to the target results of the model parameters. The preset time margin model is used for representing relationships among temperature, voltage and delay value.

It should be noted that the preset time margin model is obtained after performing a shift simplification process on the initial time margin model. The shift simplification process indicates converting some model parameters into shift numbers of the binary shift operation, so that the shift operation can be used instead of the multiplication operation.

Here, the shift operation refers to shifting the entire value to the left or to the right. For binary, shifting one bit to the left is equivalent to multiplying the original value by 2, and shifting one bit to the right is equivalent to dividing the original value by 2. Compared with the multiplication operation, the circuit implementation of the shift operation is simpler, which can reduce the circuit complexity and facilitate the circuit implementation.

In other words, the preset time margin model may be established based on the shift operation. At this time, the operation of obtaining a target delay value by performing calculation on the voltage parameter and the temperature parameter through a preset time margin model includes the following operation.

The target delay value is obtained by performing shift operation on the voltage parameter and the temperature parameter through a preset time margin model.

In some embodiments, the delay value may be regarded as a positive coefficient or a negative coefficient relationship with respect to temperature and voltage. Therefore, the model parameters of the preset time margin model include at least a first model parameter and a second model parameter. The first model parameter is used for indicating a relationship between the voltage and the delay value, and the second model parameter is used for indicating a relationship between the temperature and the delay value.

The operation of obtaining the target results of the model parameters by performing a shift simplification process on the initial results of the model parameters includes the following operations.

A target result of the first model parameter is calculated according to an initial result of the first model parameter. The target result of the first model parameter is an approximation of the initial result for the first model parameter, which is obtained by performing shift process by a first shift number on 1.

A target result of the second model parameter is calculated according to an initial result of the second model parameter. The target result of the second model parameter is an approximation of the initial result for the second model parameter, which is obtained by performing shift process by a second shift number on 1.

The operation of obtaining the preset time margin model according to the target results of the model parameters includes the following operation.

The preset time margin model is established according to the target result of the first model parameter and the target result of the second model parameter.

It should be noted that the first model parameter and the second model parameter preferably take positive numbers to facilitate conversion into shift operations.

Exemplarily, a process for establishing a preset time margin model is given below.

First, the voltage, temperature and delay value are fitted by using equation (1). The first model parameter refers to the absolute value of a, and the second model parameter refers to the absolute value of b.

$$\text{Delay} = a \cdot V + b \cdot T + c \tag{1}$$

Among them, Delay refers to the delay value, V refers to the voltage parameter, T refers to the temperature parameter, and c refers to the constant term.

After obtaining the delay values at different temperatures and different voltages, these data are input into mathematical software (such as Matlab) to obtain a fitting result. It is assumed that the fitting result is equation (2).

$$\text{Delay} = 2.2 \cdot V - 0.15 \cdot T + c \tag{2}$$

At this time, the initial result of the first model parameter is 2.2, and the initial result of the second model parameter is 0.15. According to the rules of shift operation, it may be known that the initial result of the first model parameter is approximate to the value obtained by shifting 1 to the left by one bit, and the target result of the first mode parameter is 2. It may be known that the initial result of the second mode parameter is approximate to the value obtained by shifting 1 to the right by three bits, and the target result of the second mode parameter is 0.125. At this time, the first shift number refers to shifting to the left by one bit, and the second shift number refers to shifting to the right by three bits.

That is to say, the preset time margin model is shown in formula (3).

$$\text{Delay} = 2 \cdot V - 0.125 \cdot T + c \tag{3}$$

In this way, from the perspective of shift operation, the preset time margin model includes the first shift number, the second shift number and a preset constant value. Correspondingly, the operation of obtaining the target delay value by performing calculation on the voltage parameter and the temperature parameter through the preset time margin model includes the following operations.

A first intermediate value is obtained by performing a shift operation by the first shift number on the voltage parameter.

A second intermediate value is obtained by performing a shift operation by the second shift number on the temperature parameter.

The target delay value is obtained by performing an addition operation and/or a subtraction operation on the first intermediate value, the second intermediate value and a preset constant value.

In this way, based on the preset time margin model, through shift operation and addition and subtraction operation, the target delay value can be conveniently obtained according to the voltage parameter and the temperature parameter, and the circuit implementation is simple.

In step S103, a time margin of the memory is adjusted by controlling working states of the plurality of delay sub-circuits according to the target delay value.

In this way, by adjusting the working states of the delay sub-circuits, different delay values can be implemented, so as to match the actual working conditions and improve the reliability of the semiconductor.

It should also be noted that, in a practical application scenario, the target delay value is represented by a binary code. The target delay value includes n digital bits, and the number of delay sub-circuits is n.

The operation of adjusting the time margin of the memory by controlling the working states of the plurality of the delay sub-circuits according to the target delay value includes the following operations.

An i-th delay sub-circuit is controlled to be in a delay working state when an i-th digital bit in the target delay value is a first value, so as to implement a delay transmission process of an input signal to obtain an output signal.

The i-th delay sub-circuit is controlled to be in a transmission working state when the i-th digital bit in the target delay value is a second value, so as to implement a direct transmission process of the input signal to obtain the output signal.

Here, the first value is different from the second value, n is a positive integer, and i is a positive integer less than or equal to n. For example, the first value is 1 and the second value is 0.

It should be noted that the input signal of the first delay sub-circuit is the aforementioned target signal, the input signals of other delay sub-circuits are the output signal of the previous delay sub-circuit, and the output signal of the last delay sub-circuit is the delayed target signal.

It should also be noted that, in the embodiments of the present disclosure, only the influences of voltage and temperature on the target delay value are considered. On the basis of this, more conditional parameters, such as operating frequency, may be introduced.

In view of above, the embodiments of the present disclosure provide a method for adjusting margin, and involve a circuit for adjusting margin in a memory, and use the current voltage and current temperature detected in the circuit to feedback and adjust the target delay value, which cause the margin adjustment process and the working conditions to be decoupled, and the reliability of the circuit operation to be obviously improved.

Specifically, as shown in Table 1, for the memory, a compromise target delay value (margin_delay_final) is fixed according to the actual test result before leaving the factory. At this time, for working condition 1 (i.e., voltage 1/temperature 1), working condition 2 (i.e., voltage 2/temperature 2), working condition 3 (i.e., voltage 3/temperature 3) . . . working condition (n−1) (i.e., voltage (n−1)/temperature (n−1)), working condition n (i.e., voltage n/temperature n), the target delay values are all fixed, which will inevitably adapt to some working conditions, but not to other working conditions, so that the performance of the memory decreases under some working conditions.

As shown in Table 2, in the embodiments of the present disclosure, the target delay value is not fixed. For working condition 1, the target delay value is represented as margin_delay_final_1. For working condition 2, the target delay value is represented as margin_delay_final_2. For working Condition 3, the target delay value is represented as margin_delay_final_3, . . . for working condition n−1, the target delay value is represented as margin_delay_final_n−1, and for working condition n, the target delay value is represented as margin_delay_final_n. In this way, the target delay value adapts to each working condition, so that the memory has better time margins under various working conditions, and the reliability of the memory is improved.

TABLE 1

| | |
|---|---|
| Working condition 1 | margin_delay_final |
| Working condition 2 | |
| Working condition 3 | |
| . . . | |
| Working condition n − 1 | |
| Working condition n | |

TABLE 2

| | |
|---|---|
| Working condition 1 | margin_delay_final_1 |
| Working condition 2 | margin_delay_final_2 |
| Working condition 3 | margin_delay_final_3 |
| . . . | . . . |
| Working condition n − 1 | margin_delay_final_n − 1 |
| Working condition n | margin_delay_final_n |

The embodiments provide a method for adjusting delay margin, which improves the margin adjustment mechanism in the memory. By introducing a preset time margin model, the most suitable target delay value may be calculated according to the actual working condition, so that the memory has a higher margin, and is more adaptable to different working conditions, and has higher reliability.

Figure 2:
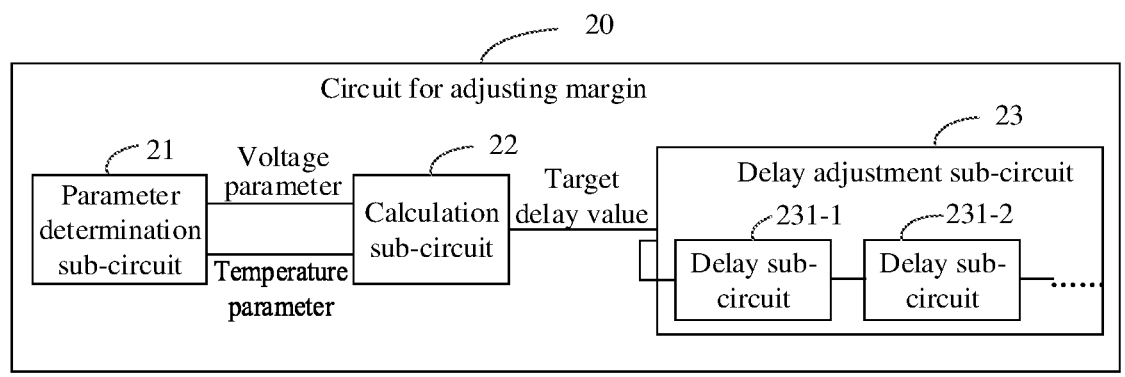
FIG. 2 is a schematic structural diagram of a circuit for adjusting margin provided by the embodiments of the present disclosure.

In another embodiment of the present disclosure, refer to FIG. 2, which shows a schematic structural diagram of a circuit for adjusting margin 20 provided by the embodiments of the present disclosure. As shown in FIG. 2, the circuit for adjusting margin 20 may include a parameter determination sub-circuit 21, a calculation sub-circuit 22 and a delay adjustment sub-circuit 23.

The parameter determination sub-circuit 21 is configured to determine a voltage parameter and a temperature parameter.

The calculation sub-circuit 22 is configured to perform calculation through a preset time margin model according to the voltage parameter and the temperature parameter to obtain the target delay value;

The delay adjustment sub-circuit 23 includes a plurality of delay sub-circuits (see the delay sub-circuit 231-1 and the delay sub-circuit 231-2 in FIG. 2), and is configured to adjust a time margin of the memory by controlling working states of the plurality of delay sub-circuits according to the target delay value.

It should be noted that the circuit for adjusting margin 20 provided in the embodiments of the present disclosure may be applicable for a memory, and the memory may be a non-volatile memory or a volatile memory.

In the embodiments of the present disclosure, the delay adjustment sub-circuit 23 includes a plurality of delay sub-circuits whose working states are adjustable, and the plurality of delay sub-circuits are connected in series and jointly arranged on a certain signal path in the memory. The input end of the delay sub-circuit in the first place is used for receiving the target signal, and the output end of each delay sub-circuit is connected to the input end of the next delay sub-circuit, and the output end of the delay sub-circuit in the last place is used for outputting the delayed target signal. The target signal may be any working signal in the memory, such as a clock signal, a command signal, or an address signal.

Therefore, the memory can adaptively determine the target delay value according to the actual working conditions (voltage, temperature), and then adjust the working state of each delay sub-circuit to control the delay time of the target signal. The memory is expected to have better time margins under various working conditions, and the reliability of the memory is improved.

Figure 3:
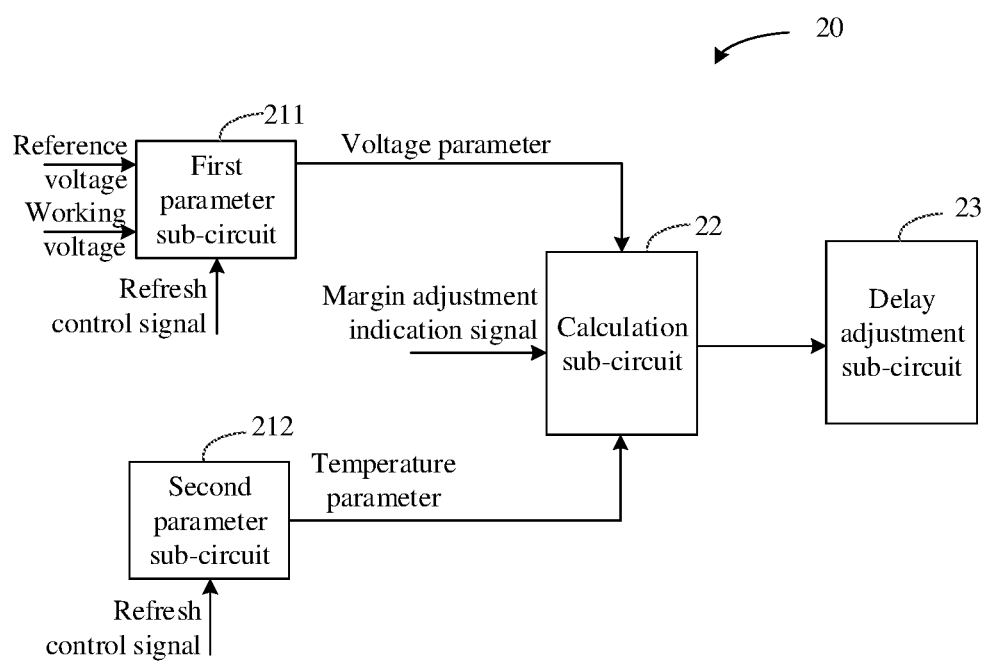
FIG. 3 is a schematic structural diagram of another circuit for adjusting margin provided by the embodiments of the present disclosure.

As shown in FIG. 3, in some embodiments, the parameter determination sub-circuit 21 includes a first parameter sub-circuit 211 and a second parameter sub-circuit 212.

The first parameter sub-circuit 211 is configured to determine a current voltage (working voltage) and a reference voltage (refresh voltage) after receiving a refresh control signal, and generate the voltage parameter by comparing the current voltage with a reference voltage.

The second parameter sub-circuit 212 is configured to determine a current temperature after receiving the refresh control signal, and generate the temperature parameter according to the current temperature.

It should be noted that the refresh control signal is used to instruct the first parameter sub-circuit 211 and the second parameter sub-circuit 212 to obtain the latest voltage parameter and the latest temperature parameter, respectively, to indicate the actual working condition.

In some embodiments, the reference voltage includes a first voltage threshold, a second voltage threshold, and a third voltage threshold.

The first parameter sub-circuit is specifically configured to generate a first voltage parameter in a case that the current voltage is less than the first voltage threshold, or generate a second voltage parameter in a case that the current voltage is greater than or equal to the first voltage threshold and the current voltage is less than the second voltage threshold, or generate a third voltage parameter in a case that the current voltage is greater than or equal to the second voltage threshold and the current voltage is less than the third voltage threshold, or generate a fourth voltage parameter in a case that the current voltage is greater than or equal to the third voltage threshold.

Exemplarily, the first voltage threshold is 1.1V, the second voltage threshold is 1.2V, and the third voltage threshold is 1.3V.

In some embodiments, the second parameter sub-circuit is specifically configured to obtain the current temperature by performing temperature measurement on the memory, and to obtain the temperature parameter by performing encoding process on the current temperature.

It may be seen from the above that the first parameter sub-circuit 211 divides several voltage ranges in advance, and determines the voltage parameter according to the voltage range to which the current voltage belongs, which can reduce the amount of calculation in the subsequent process. The second parameter sub-circuit 212 directly encodes the current temperature to obtain temperature parameter.

It should be understood that the second parameter sub-circuit 212 may also choose to divide several temperature ranges, and determine the temperature parameter according to the temperature range to which the current temperature belongs.

In some embodiments, the calculation sub-circuit 22 is specifically configured to determine a first shift number, a second shift number and a preset constant value, and obtain a first intermediate value by performing a shift operation by the first shift number on the voltage parameter, obtain a second intermediate value by performing a shift operation by the second shift number on the temperature parameter, and obtain the target delay value by performing an addition operation and/or a subtraction operation on the first intermediate value, the second intermediate value and a preset constant value.

Here, the preset time margin model includes a first model parameter, a second model parameter and the preset constant value. The first model parameter is used for describing a relationship between the voltage and the delay value, and the second model parameter is used for describing a relationship between the temperature and the delay value. Meanwhile, the first shift number is obtained by converting the first model parameter into a shift operation, and the second shift number is obtained by converting the second model parameter into a shift operation.

It should be noted that the preset time margin model may be established by an external device or the calculation sub-circuit 22 according to the test result after the actual margin test is performed on the memory. For the manner of establishing the preset time margin model, reference may be made to the foregoing content. Elaborations are omitted herein.

It should be noted that, in some embodiments, as shown in FIG. 3, the calculation sub-circuit 22 is specifically configured to obtain the target delay value by performing a shift operation (and addition operation and subtraction operation) on the voltage parameter and the temperature parameter after receiving the margin adjustment indication signal (typical testmode). That is to say, the margin adjustment indication signal is used for instructing to enter the margin adjustment mode, at which time the calculation sub-circuit 22 starts to work.

In this way, the target delay value may be obtained by performing shift operation and/or addition and subtraction operation on the voltage parameter and the temperature parameter through the calculation sub-circuit, the processing process is simple, and the power consumption is low.

It should be understood that, in practical circuit applications, the calculation sub-circuit is further configured to convert the target delay value in numerical form into a target delay value in binary encoding form based on the configuration of the delay adjustment sub-circuit, and the number of bits of the binary encoding is consistent with the number of delay sub-circuits. At this time, each digital bit in the target delay value in the binary encoding form may be used to control the working state of one delay sub-circuit. That is, the target delay value includes n digital bits, and the number of delay sub-circuits is n.

The delay adjustment sub-circuit 23 is specifically configured to control an i-th delay sub-circuit to be in a delay working state when an i-th digital bit in the target delay value is a first value, so as to implement a delay transmission process of an input signal to obtain an output signal; or, control the i-th delay sub-circuit to be in a transmission working state when the i-th digital bit in the target delay value is a second value, so as to implement a direct transmission process of the input signal to obtain the output signal.

It should be noted that the first value is different from the second value, n is a positive integer, and i is a positive integer less than or equal to n. The first value may be 1/the second value may be 0, or the first value may be 0/the second value may be 1.

In some embodiments, each delay sub-circuit delays the input signal for the same length of time. For example, each delay sub-circuit delays the input signal by a time length of 0.1 nanoseconds (ns).

In some embodiments, the time length for delaying the input signal by the i-th delay sub-circuit has a corresponding relationship with the bit weight of the i-th digital bit. Exemplarily, the first delay sub-circuit may delay the input signal by 0.1 ns, the second delay sub-circuit may delay the input signal by 0.2 ns, and the third delay sub-circuit may delay the input signal by 0.4 ns . . . . When the target delay value in numerical form is 0.9 ns, in units of 0.1 ns, 0.9 ns may be converted into a target delay value in binary encoding form of 1001, and each digital bit controls the working state of a delay sub-circuit respectively. In this way, the first delay sub-circuit delays the input signal by 0.1 seconds, the second delay sub-circuit and the third delay sub-circuit do not delay the input signal, and the fourth delay sub-circuit delays the input signal by 0.8 seconds, so that the target signal obtains a delay of 0.9 seconds.

Figure 4:
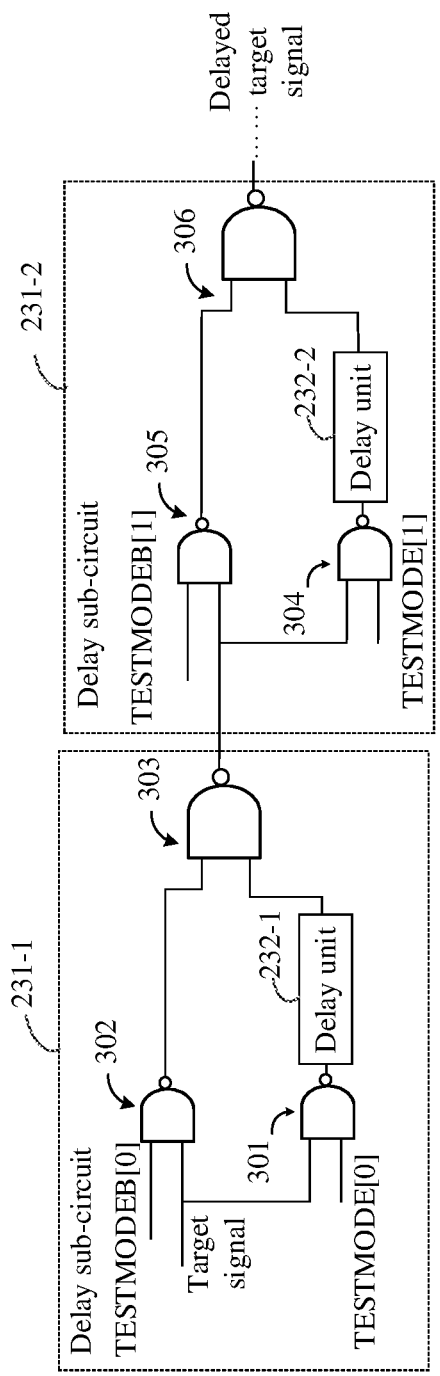
FIG. 4 is a schematic structural diagram of yet another circuit for adjusting margin provided by the embodiments of the present disclosure.

In a specific embodiment, as shown in FIG. 4, each of the delay sub-circuits includes a delay unit (see delay unit 232-1, delay unit 232-2 . . . in FIG. 4), the each delay sub-circuit is provided with a first path and a second path, and the delay unit is connected in series on the first path. The delay unit may be a second delay sub-circuit or a delay component which is a hardware element having delay function.

The i-th delay sub-circuit is configured to receive the i-th positive phase control signal TESTMODE [i] (e.g., TESTMODE[0], TESTMODE[1]) and the i-th reverse phase control signal TESTMODEB[i] (e.g., TESTMODEB[0], TESTMODEB[1]).

The output signal is obtained by transmitting the input signal through the first path when the i-th positive phase control signal TESTMODE[i] is in a first level state and the i-th inverse phase control signal TESTMODEB[i] is in a second level state.

Optionally, the output signal is obtained by transmitting the input signal through the second path when the i-th positive phase control signal TESTMODE[i] is in the second level state and the i-th inverse phase control signal TESTMODEB[i] is in a first level state.

It should be noted that the i-th positive phase control signal TESTMODE[i] is in the first level state when the i-th digital bit in the target delay value is a first value, the i-th positive phase control signal TESTMODE[i] is in the second level state when the i-th digital bit in the target delay value is a second value, and a level state of the i-th positive phase control signal is different from a level state of the i-th reverse phase control signal.

Here, the first level state and the second level state are relatively defined, and their specific values may be determined according to actual application scenarios.

In some implementations, the structures of different delay sub-circuits are the same or similar.

As shown in FIG. 4, the delay sub-circuit further includes a first NAND gate (e.g., the first NAND gate 301 and the first NAND gate 304 in FIG. 4), a second NAND gate (e.g., the second NAND gate 302 and the second NAND gate 305 in FIG. 4) and the third NAND gate (e.g., the third NAND gate 303 and the third NAND gate 306 in FIG. 4).

Taking the delay sub-circuit 231-1 as an example, the first input end of the first NAND gate 301 is connected to the positive phase control signal TESTMODE[0], and the output end of the first NAND gate 301 is connected to the input end of the delay unit 232-1, the output end of the delay unit 232-1 is connected to a first input end of the third NAND gate 303, so as to form the first path.

The first input end of the second NAND gate 302 is connected to the inverse phase control signal TESTMODEB[0], and the output end of the second NAND gate 302 is connected to the second input end of the third NAND gate 303, so as to form the second path.

In addition, a second input end of the first NAND gate and a second input end of the second NAND gate are both connected to the target signal in a case that i is 1. The second input end of the first NAND gate and the second input end of the second NAND gate are both connected to an output end of the third NAND gate in a (i–1)-th delay sub-circuit in a case that i is greater than 1. The output end of the third NAND gate is configured to output a delayed target signal in a case that i equals to n.

In specific process of the signal delay will be described below with reference to FIG. 4. It is assumed that the delay unit 232-1 can delay the signal by 0.1 ns, the delay unit 232-2 can delay the signal by 0.2 ns, the first level state is logic 0, and the second level state is logic 1.

In one case, the target delay value is 0.3 ns, TESTMODE[0]=TESTMODE[1]=logic 0 and TESTMODEB[0]=TESTMODEB[1]=logic 1 are set correspondingly. Taking the target signal as a logic 1 as an example, in the delay sub-circuit 231-1, the first NAND gate 301 receives a logic 1 and a logic 0, and outputs a logic 1. At this time, the delay unit 232-1 delays the logic 1 and outputs logic 1 with a delay of 0.1 ns. The second NAND gate 302 receives two logic 1 and outputs a logic 0, and the third NAND gate 303 receives a logic 1 with a delay of 0.1 ns and a logic 0, and outputs a logic 1 with a delay of 0.1 ns. In the delay sub-circuit 231-2, the first NAND gate 304 receives a logic 1 with a delay of 0.1 ns and a logic 0, and outputs a logic 1 with a delay of 0.1 ns, and the delay unit 232-2 delays the logic 1 with a delay of 0.1 ns again, and outputs a logic 1 with a delay of 0.3 ns, the second NAND gate 305 receives a logic 1 with a delay of 0.3 ns and another logic 1, and outputs a logic 0, and the third NAND gate 306 receives a logic 1 with a delay of 0.3 ns and a logic 0, and outputs a logic 1 with a delay of 0.3 ns, which is equivalent to the target signal being delayed by 0.3 ns.

That is to say, for the target signal logic 1, the delay sub-circuit 231-1 is in a delay working state, the first path is connected, and the second path is disconnected, the signal is delayed by the delay unit 232-1, and the logic 1 with a delay of 0.1 ns is output. The delay sub-circuit 231-2 is also in a delay working state, in which the first path is connected, the second path is disconnected, the signal is delayed by the delay unit 232-2, and the logic 1 with a delay of 0.3 ns is output.

In another case, the target delay value is 0.1 ns, TESTMODE[0]=logic 0, TESTMODEB[0]=logic 1, TESTMODE [1]=logic 1, and TESTMODEB[1]=logic 0 are set correspondingly. Taking the target signal as a logic 1 as an example, in the delay sub-circuit 231-1, the first NAND gate 301 receives a logic 1 and a logic 0, and outputs a logic 1. At this time, the delay unit 232-1 delays the logic 1 and outputs logic 1 with a delay of 0.1 ns. The second NAND gate 302 receives two logic 1 and outputs a logic 0, and the third NAND gate 303 receives the logic 1 with a delay of 0.1 ns and a logic 0, and outputs the logic 1 with a delay of 0.1 ns. In the delay sub-circuit 231-2, the first NAND gate 304 receives the logic 1 with a delay of 0.1 ns and another logic 1, and outputs a logic 0. At this time, the delay unit 232-2 is disconnected, and the second NAND gate 305 receives the logic 1 with a delay of 0.1 ns and logic 0, and output the logic 1 with a delay of 0.1 ns. The third NAND gate 306 receives the logic 1 with a delay of 0.1 ns and a logic 0, and outputs the logic 1 with a delay of 0.1 ns, which is equivalent to the target signal being delayed by 0.1 ns.

It should be understood that the delay mentioned above does not include the inherent transmission delay of the circuit.

That is to say, for the target signal logic 1, the delay sub-circuit 231-1 is in a delay working state, the first path is connected, and the second path is disconnected, the signal is delayed by the delay unit 232-1, and the logic 1 with a delay of 0.1 ns is output. The delay sub-circuit 231-2 is in a transmission working state, the first path is disconnected, the second path is connected, the delay unit 232-2 does not perform signal delay, and the output is still the logic 1 with a delay of 0.1 ns.

Figure 5:
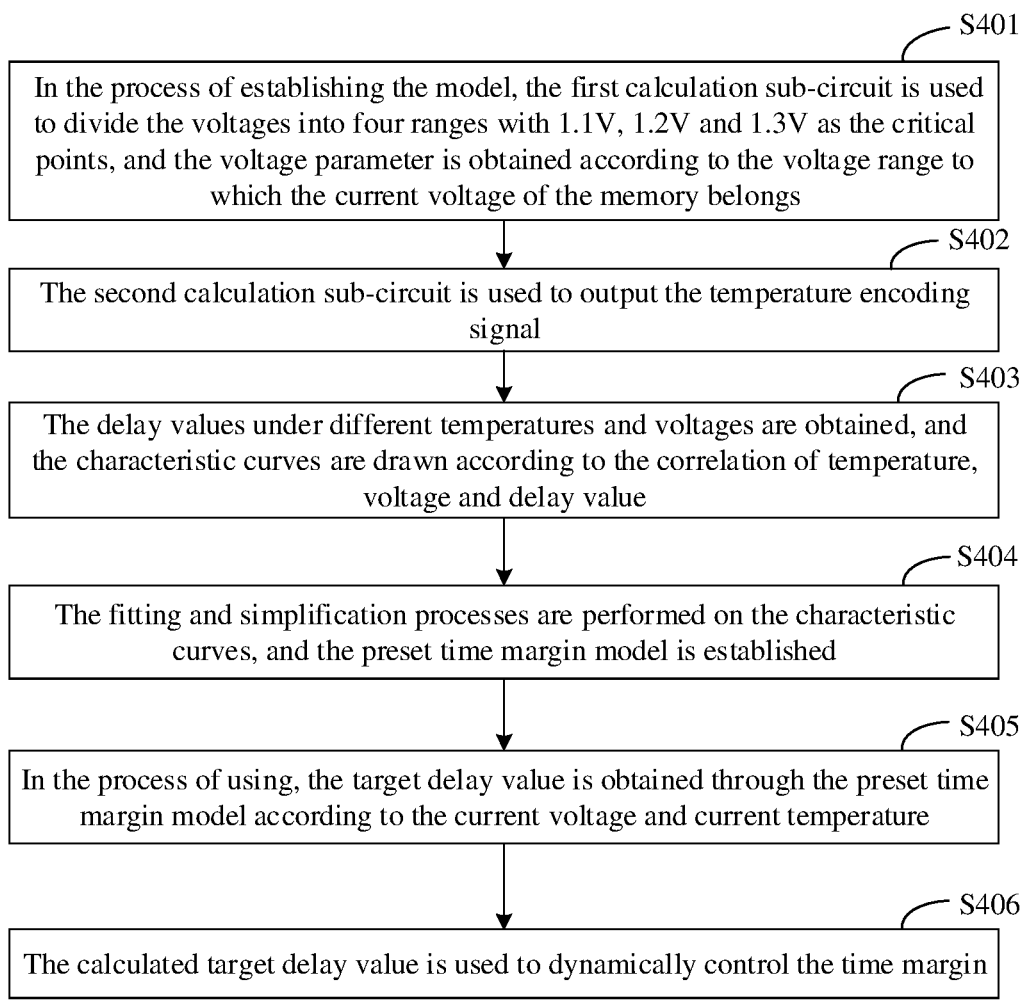
FIG. 5 is a schematic flowchart of still yet another method for adjusting margin provided by the embodiments of the present disclosure.

Based on the above circuit for adjusting margin 20, a method for adjusting margin is provided below. Referring to FIG. 5, it shows a schematic flowchart of another method for adjusting margin provided by the embodiments of the present disclosure. As shown in FIG. 5, the method includes the following steps.

In step S401, in the process of establishing the model, the first calculation sub-circuit is used to divide the voltages into four ranges with 1.1V, 1.2V and 1.3V as the critical points, and the voltage parameter is obtained according to the voltage range to which the current voltage of the memory belongs.

It should be noted that an indication signal is set for each voltage range, and according to the voltage range to which the current voltage belongs, the corresponding indication signal is controlled to be valid and the remaining indication signals are invalid. At this time, the indication signal in the valid state forms the voltage parameter.

In step S402, the second calculation sub-circuit is used to output the temperature encoding signal.

It should be noted that the second calculation sub-circuit may reuse the temperature sensor in the DRAM.

In step S403, the delay values under different temperatures and voltages are obtained, and the characteristic curves are drawn according to the correlation of temperature, voltage and delay value.

It should be noted that the delay value (also called Margin Delay) refers to the ideal delay of the target signal under the actual working condition.

In step S404, the fitting and simplification processes are performed on the characteristic curves, and the preset time margin model is established.

It should be noted that the preset time margin model is used for representing the relationships among delay value, temperature and voltage.

In step S405, in the process of using, the target delay value is obtained through the preset time margin model according to the current voltage and current temperature.

In step S406, the calculated target delay value is used to dynamically control the time margin.

In this way, as shown in Table 3, under different voltages and temperatures, the target delay values are different, resulting in better semiconductor performance. In Table 3, the target delay value is represented by delay.

TABLE 3

| Voltage | Temperature | Target delay value | |
|---|---|---|---|
| V 1 | T1 | delay_1 | V1 represents that the current voltage is less than 1.1 V |
| V 2 | T1 | delay_2 | V2 represents that the current voltage is greater than or equal to 1.1 V and is less than 1.2 V |
| V 3 | T1 | delay_3 | V3 represents that the current voltage is greater than or equal to 1.2 V and is less than 1.3 V |
| V 4 | T1 | delay_4 | V4 represents that the current voltage is greater than or equal to 1.3 V |
| V 1 | T2 | delay_5 | |
| V 2 | T2 | delay_6 | |
| V 3 | T2 | delay_7 | |
| V 4 | T2 | delay_8 | |
| ... | ... | ... | ... |
| V 1 | T6 | delay_N | |
| V 2 | T6 | delay_N + 1 | |
| V 3 | T6 | delay_N + 2 | |
| V 4 | T6 | delay_N + 3 | |

At present, although the method of fixing a margin adjustment value through the test mode can meet the margin requirements under various test conditions to a certain extent, the margin adjustment value is a fixed value for any condition, not an optimal value. The embodiments of the present disclosure mainly improve the circuit, and use the actually detected temperature and voltage feedback to control the margin adjustment circuit, so that the margin adjustment is more adaptive, and the delay values adapt to various working conditions, so as to make the reliability of the circuit work better.

The embodiments of the present disclosure provide a circuit for adjusting margin, which can adaptively adjust the time margin of the memory according to temperature and voltage feedback logic, so that the memory is expected to have better time margins under various working conditions and the reliability of the memory is improved. At the same time, instead of using traditional real-time encoding parameter, the voltage parameter is obtained by using a comparator (i.e., the second calculation sub-circuit) to divide the working range, which can reduce the workload.

Figure 6:
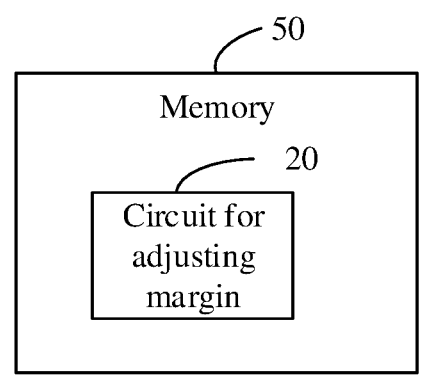
FIG. 6 is a schematic structural diagram of a semiconductor memory provided by the embodiments of the present disclosure.

In another embodiment of the present disclosure, referring to FIG. 6, it shows a schematic structural diagram of the composition of a memory 50 provided by the embodiments of the present disclosure. As shown in FIG. 6, the memory 50 may include the circuit for adjusting margin 20 of any of the above embodiments.

In this way, in the embodiments of the present disclosure, for the semiconductor memory 50, it includes the circuit for adjusting margin 20, which adaptively adjusts the time margin of the memory according to the temperature and the voltage feedback logic. The memory is expected to have better time margins under various working conditions and the reliability of the memory is improved.

The above embodiments are only preferred embodiments of the present disclosure, and are not intended to limit the protection scope of the present disclosure.

It should be noted that, in the present disclosure, the terms "comprising", "including" or any other variation thereof are intended to encompass non-exclusive inclusion, such that a process, method, object or device comprising a series of elements includes not only those elements, but also other elements not expressly listed or inherent to such a process, method, object or device. Without further limitation, an element limited by the phrase "comprising a . . . " does not preclude the presence of additional identical elements in a process, method, object or device that includes the element.

The above serial numbers of the embodiments of the present disclosure are only for description, and do not represent the advantages or disadvantages of the embodiments.

The methods disclosed in the several method embodiments provided in the present disclosure can be combined arbitrarily without conflict to obtain new method embodiments.

The features disclosed in the several product embodiments provided in the present disclosure can be combined arbitrarily without conflict to obtain a new product embodiment.

The features disclosed in several method or device embodiments provided in the present disclosure can be combined arbitrarily without conflict to obtain new method embodiments or device embodiments.

The above embodiments are only specific embodiments of the present disclosure, but the protection scope of the present disclosure is not limited thereto. Any person skilled in the art who is familiar with the technical scope of the present disclosure can easily think of changes or substitutions, which should cover within the scope of protection of the present disclosure. Therefore, the protection scope of the present disclosure should be subject to the protection scope of the claims.

The invention claimed is:

1. A method for adjusting margin, applicable for a memory comprising a plurality of delay sub-circuits, comprising:
   determining a voltage parameter and a temperature parameter;
   obtaining a target delay value by performing calculation on the voltage parameter and the temperature parameter through a preset time margin model; and
   adjusting a time margin of the memory by controlling working states of the plurality of delay sub-circuits according to the target delay value,
   wherein determining the voltage parameter and the temperature parameter comprises:
      acquiring a current voltage and a current temperature;
      generating the voltage parameter by comparing the current voltage with a reference voltage; and
      generating the temperature parameter by performing encoding process on the current temperature.

2. The method for adjusting margin of claim 1, wherein the reference voltage comprises a first voltage threshold, a second voltage threshold and a third voltage threshold; and generating the voltage parameter by comparing the current voltage with the reference voltage comprises:
   generating a first voltage parameter in a case that the current voltage is less than the first voltage threshold;
   generating a second voltage parameter in a case that the current voltage is greater than or equal to the first voltage threshold and the current voltage is less than the second voltage threshold;
   generating a third voltage parameter in a case that the current voltage is greater than or equal to the second voltage threshold and the current voltage is less than the third voltage threshold; and
   generating a fourth voltage parameter in a case that the current voltage is greater than or equal to the third voltage threshold.

3. The method for adjusting margin of claim 2, wherein the first voltage threshold is 1.1V, the second voltage threshold is 1.2V, and the third voltage threshold is 1.3V.

4. The method for adjusting margin of claim 1, further comprising:
   obtaining a test result by performing a time margin test on the memory, wherein the test result comprise delay values of the memory at different temperatures and different voltages;
   determining an initial time margin model by performing curve fitting process according to the test result, wherein the initial time margin model comprises initial results of model parameters;
   obtaining target results of the model parameters by performing a shift simplification process on the initial results of the model parameters; and
   obtaining the preset time margin model according to the target results of the model parameters, wherein the preset time margin model is used for representing relationships among temperature, voltage and delay value.

5. The method for adjusting margin of claim 4, wherein the model parameters comprise a first model parameter and a second model parameter, the first model parameter is used for indicating a relationship between the voltage and the delay value, and the second model parameter is used for indicating a relationship between the temperature and the delay value;
   wherein obtaining the target results of the model parameters by performing the shift simplification process on the initial results of the model parameters comprises:
      calculating a target result of the first model parameter according to an initial result of the first model parameter, wherein the target result of the first model parameter is an approximation of the initial result of the first model parameter, which is obtained by performing shift process by a first shift number on 1; and
      calculating a target result of the second model parameter according to an initial result of the second model parameter, wherein the target result of the second model parameter is an approximation of the initial result of the second model parameter, which is obtained by performing the shift process by a second shift number on 1;
   wherein obtaining the preset time margin model according to the target results of the model parameters comprises:
      establishing the preset time margin model according to the target result of the first model parameter and the target result of the second model parameter.

6. The method for adjusting margin of claim 5, wherein obtaining the target delay value by performing calculation on the voltage parameter and the temperature parameter through the preset time margin model comprises:
   obtaining a first intermediate value by performing a shift operation by the first shift number on the voltage parameter;
   obtaining a second intermediate value by performing the shift operation by the second shift number on the temperature parameter; and
   obtaining the target delay value by performing at least one of an addition operation or a subtraction operation on the first intermediate value, the second intermediate value and a preset constant value.

7. The method for adjusting margin of claim 1, wherein the target delay value comprises n digital bits, and a number of delay sub-circuits in the plurality of delay sub-circuits is n;
   wherein adjusting the time margin of the memory by controlling the working states of the plurality of delay sub-circuits according to the target delay value comprises:
      controlling an i-th delay sub-circuit of the plurality of delay sub-circuits to be in a delay working state when an i-th digital bit in the target delay value is a first value, so as to implement a delay transmission process of an input signal to obtain an output signal; and
      controlling the i-th delay sub-circuit to be in a transmission working state when the i-th digital bit in the target delay value is a second value, so as to implement a direct transmission process of the input signal to obtain the output signal, wherein the first value is different from the second value, n is a positive integer, and i is a positive integer less than or equal to n.

8. A circuit for adjusting margin, applicable for a memory, comprising:
a parameter determination sub-circuit, configured to determine a voltage parameter and a temperature parameter;
a calculation sub-circuit, configured to obtain a target delay value by performing calculation on the voltage parameter and the temperature parameter through a preset time margin model; and
a delay adjustment sub-circuit, comprising a plurality of delay sub-circuits, configured to adjust a time margin of the memory by controlling working states of the plurality of delay sub-circuits according to the target delay value;
wherein the parameter determination sub-circuit comprises a first parameter sub-circuit and a second parameter sub-circuit,
wherein the first parameter sub-circuit is configured to determine a current voltage and a reference voltage after receiving a refresh control signal, and generate the voltage parameter by comparing the current voltage with the reference voltage, and
wherein the second parameter sub-circuit is configured to determine a current temperature after receiving the refresh control signal, and generate the temperature parameter according to the current temperature.

9. The circuit for adjusting margin of claim 8, wherein the reference voltage comprises a first voltage threshold, a second voltage threshold, and a third voltage threshold,
wherein the first parameter sub-circuit is specifically configured to generate a first voltage parameter in a case that the current voltage is less than the first voltage threshold, or generate a second voltage parameter in a case that the current voltage is greater than or equal to the first voltage threshold and the current voltage is less than the second voltage threshold, or generate a third voltage parameter in a case that the current voltage is greater than or equal to the second voltage threshold and the current voltage is less than the third voltage threshold, or generate a fourth voltage parameter in a case that the current voltage is greater than or equal to the third voltage threshold.

10. The circuit for adjusting margin of claim 8, wherein the second parameter sub-circuit is specifically configured to obtain the current temperature by performing temperature measurement on the memory, and to obtain the temperature parameter by performing encoding process on the current temperature.

11. The circuit for adjusting margin of claim 8, wherein the calculation sub-circuit is specifically configured to
determine a first shift number, a second shift number and a preset constant value; and
obtain a first intermediate value by performing a shift operation by the first shift number on the voltage parameter, obtain a second intermediate value by performing the shift operation by the second shift number on the temperature parameter, and obtain the target delay value by performing at least one of an addition operation or a subtraction operation on the first intermediate value, the second intermediate value and a preset constant value, wherein the preset time margin model comprises a first model parameter, a second model parameter and the preset constant value, the first shift number is obtained according to the first model parameter, and the first model parameter is used for describing a relationship between a voltage and a delay value, the second shift number is obtained according to the second model parameter, and the second model parameter is used for describing a relationship between a temperature and the delay value.

12. The circuit for adjusting margin of claim 8, wherein the target delay value comprises n digital bits, and a number of delay sub-circuits in the plurality of delay sub-circuits is n, wherein
the delay adjustment sub-circuit is specifically configured to control an i-th delay sub-circuit of the plurality of delay sub-circuits to be in a delay working state when an i-th digital bit in the target delay value is a first value, so as to implement a delay transmission process of an input signal to obtain an output signal; or, control the i-th delay sub-circuit to be in a transmission working state when the i-th digital bit in the target delay value is a second value, so as to implement a direct transmission process of the input signal to obtain the output signal,
the first value is different from the second value, n is a positive integer, and i is a positive integer less than or equal to n.

13. The circuit for adjusting margin of claim 12, wherein each of the plurality of delay sub-circuits comprises a delay unit, the each of the plurality of delay sub-circuit is provided with a first path and a second path, and the delay unit is connected in series on the first path;
wherein the i-th delay sub-circuit is configured to receive the input signal, an i-th positive phase control signal and an i-th inverse phase control signal; and
obtain the output signal by transmitting the input signal through the first path when the i-th positive phase control signal is in a first level state and the i-th inverse phase control signal is in a second level state; or obtain the output signal by transmitting the input signal through the second path when the i-th positive phase control signal is in the second level state and the i-th inverse phase control signal is in the first level state;
wherein the i-th positive phase control signal is in the first level state when the i-th digital bit in the target delay value is the first value, the i-th positive phase control signal is in the second level state when the i-th digital bit in the target delay value is the second value, and a level state of the i-th positive phase control signal is different from a level state of the i-th inverse phase control signal.

14. The circuit for adjusting margin of claim 13, wherein the i-th delay sub-circuit further comprises a first NAND gate, a second NAND gate and a third NAND gate, wherein
a first input end of the first NAND gate is connected to the i-th positive phase control signal, an output end of the first NAND gate is connected to an input end of the i-th delay sub-circuit, an output end of the i-th delay sub-circuit is connected to a first input end of the third NAND gate, so as to form the first path;
a first input end of the second NAND gate is connected to the i-th inverse phase control signal, and an output end of the second NAND gate is connected to a second input end of the third NAND gate, so as to form the second path; and a second input end of the first NAND gate and a second input end of the second NAND gate are both connected to a target signal in a case that i is 1; the second input end of the first NAND gate and the second input end of the second NAND gate are both connected to an output end of the third NAND gate in a (i−1)-th delay sub-circuit of the plurality of delay sub-circuits in a case that i is greater than 1, and the output end of the third NAND gate is configured to output a delayed target signal in a case that i equals to n.

15. A memory, comprising a circuit for adjusting margin, wherein the circuit comprises:
- a parameter determination sub-circuit, configured to determine a voltage parameter and a temperature parameter;
- a calculation sub-circuit, configured to obtain a target delay value by performing calculation on the voltage parameter and the temperature parameter through a preset time margin model; and
- a delay adjustment sub-circuit, comprising a plurality of delay sub-circuits, configured to adjust a time margin of the memory by controlling working states of the plurality of delay sub-circuits according to the target delay value;
- wherein the parameter determination sub-circuit comprises a first parameter sub-circuit and a second parameter sub-circuit,
- wherein the first parameter sub-circuit is configured to determine a current voltage and a reference voltage after receiving a refresh control signal, and generate the voltage parameter by comparing the current voltage with the reference voltage, and
- wherein the second parameter sub-circuit is configured to determine a current temperature after receiving the refresh control signal, and generate the temperature parameter according to the current temperature.

16. The memory of claim 15, wherein the reference voltage comprises a first voltage threshold, a second voltage threshold, and a third voltage threshold,
- wherein the first parameter sub-circuit is specifically configured to generate a first voltage parameter in a case that the current voltage is less than the first voltage threshold, or generate a second voltage parameter in a case that the current voltage is greater than or equal to the first voltage threshold and the current voltage is less than the second voltage threshold, or generate a third voltage parameter in a case that the current voltage is greater than or equal to the second voltage threshold and the current voltage is less than the third voltage threshold, or generate a fourth voltage parameter in a case that the current voltage is greater than or equal to the third voltage threshold.

17. The memory of claim 15, wherein
the second parameter sub-circuit is specifically configured to obtain the current temperature by performing temperature measurement on the memory, and to obtain the temperature parameter by performing encoding process on the current temperature.

* * * * *